United States Patent
Kim et al.

(10) Patent No.: US 11,003,267 B2
(45) Date of Patent: May 11, 2021

(54) DISPLAY APPARATUS HAVING TOUCH SCREEN

(71) Applicant: LG DISPLAY CO., LTD., Seoul (KR)

(72) Inventors: Yongchul Kim, Paju-si (KR); Sejong Yoo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/219,642

(22) Filed: Dec. 13, 2018

(65) Prior Publication Data

US 2019/0179467 A1 Jun. 13, 2019

(30) Foreign Application Priority Data

Dec. 13, 2017 (KR) ........................ 10-2017-0171629

(51) Int. Cl.
| | |
|---|---|
| *G06F 3/041* | (2006.01) |
| *G06F 3/044* | (2006.01) |
| *G06F 3/047* | (2006.01) |
| *H01L 27/32* | (2006.01) |
| *G09G 3/3291* | (2016.01) |

(52) U.S. Cl.
CPC ............ *G06F 3/0412* (2013.01); *G06F 3/044* (2013.01); *G06F 3/047* (2013.01); *G06F 3/0416* (2013.01); *G06F 3/0446* (2019.05); *G06F 3/04164* (2019.05); *G06F 3/04166* (2019.05); *G09G 3/3291* (2013.01); *H01L 27/323* (2013.01); *H01L 27/3262* (2013.01); *H01L 27/3276* (2013.01); *G09G 2300/0426* (2013.01); *G09G 2300/0439* (2013.01); *G09G 2310/0286* (2013.01); *G09G 2310/08* (2013.01)

(58) Field of Classification Search
CPC ........ G06F 3/0412; G06F 3/044; G06F 3/047; G06F 3/0416; H01L 27/323; H01L 27/3276; H01L 27/3262; G09G 3/3291; G09G 2300/0439; G09G 2310/0286; G09G 2310/08; G09G 2300/0426
See application file for complete search history.

(56) References Cited

U.S. PATENT DOCUMENTS

| | | | |
|---|---|---|---|
| 2008/0036706 A1* | 2/2008 | Kitazawa | ............. G09G 3/3233 345/76 |
| 2016/0246432 A1* | 8/2016 | Hong | ..................... G06F 1/1652 |
| 2017/0357353 A1* | 12/2017 | Katsuta | ................. G06F 3/0412 |

* cited by examiner

*Primary Examiner* — Shaheda A Abdin
(74) *Attorney, Agent, or Firm* — Birch, Stewart, Kolasch & Birch, LLP

(57) ABSTRACT

A display apparatus having a touch screen can include a display area and a non-display area; a plurality of first touch electrodes in the display area; a plurality of second touch electrodes crossing over the plurality of first touch electrodes; a gate driver in the non-display area and configured to generate gate signals; a switching unit in the non-display area of the display panel and configured to be controlled based on the gate signals; at least one touch signal supply line in the non-display area of the display panel and configured to supply a touch driving signal to the switching unit; a plurality of first touch routing lines in the non-display area and configured to receive the touch driving signal from the switching unit and supply the touch driving signal to the plurality of first touch electrodes; and a plurality of second touch routing lines in the non-display area of the display panel and configured to sense the plurality of second touch electrodes.

19 Claims, 12 Drawing Sheets

DISPLAY APPARATUS HAVING TOUCH SCREEN

This application claims the benefit of priority under 35 U.S.C. § 119(a) to Korean Patent Application No. 10-2017-0171629 filed in the Republic of Korea on Dec. 13, 2017, which is incorporated herein by reference in its entirety.

BACKGROUND OF THE INVENTION

1. Field of the Invention

The present disclosure relates to a display apparatus having a touch screen.

2. Description of Related Art

As the information society has advanced, demand for display apparatus for displaying images in various forms has increased. For example, flat panel displays (FPDs), which are thinner, lighter, and larger than bulky cathode ray tubes (CRTs) and able to replace them, have rapidly been developed. Also, various FPDs, such as a liquid crystal display (LCD), a plasma display panel (PDP), an electroluminescence display (EL), a field emission display (FED), and an electrophoretic display (ED), have been developed and utilized.

These display apparatuses have been used in various electronic products, such as TVs, computer monitors, notebook computers, mobile phones, display units of refrigerators, personal digital assistants, and automated teller machines and the like. In general, such display apparatuses configure an interface with users using various input devices such as keyboards, mouses, digitizers, and the like. However, the use of a separate input device, such as a keyboard and a mouse, requires users to learn how to use it and causes inconvenience, such as occupying space, and makes it difficult to improve completeness of the product. Thus, demand for input devices which are convenient and simple and can reduce malfunctions is growing. To meet the demand, touch screens allowing users to input information by directly contacting a screen with a hand, pen, or the like, have been proposed.

The touch screen may be classified as an add-on type, an on-cell type, and an integrated type according to structures.

In the add-on type touch screen, a display apparatus and a touch panel are separately manufactured, and then the touch panel is adhered to an upper plate of the display apparatus.

In the on-cell type touch screen, elements constituting a touch screen are directly formed on a surface of a top plate of a display apparatus.

In the integrated type touch screen, elements constituting a touch screen are formed on an inner side of a top plate of a display apparatus.

These touch screens may be applied to various display apparatuses. In particular, when a touch screen is applied to an electroluminescence display apparatus, elements constituting the electroluminescence display apparatus may be formed on an upper surface and/or lower surface of an encapsulation film for protecting an emission unit of a display panel of the electroluminescence display apparatus.

FIG. 1 is a view illustrating a related art display apparatus having a touch screen.

Referring to FIG. 1, it is illustrated that touch driving electrodes Tx1 to Tx6 constituting a touch driving signal transmission channel of a touch screen and touch sensing electrodes Rx1 to Rx4 constituting a touch recognition signal reception channel are formed in a display area DA of a separate touch screen panel and subsequently adhered to an upper surface of an encapsulation film ENC of a display panel, or the touch driving electrodes Tx1 to Tx6 and the touch sensing electrodes Rx1 to Rx4 are directly formed on an upper surface and/or a lower surface of the encapsulation film ENC of the display panel.

In the display apparatus having such a configuration, touch driving routing lines TW1 to TW6 and touch sensing routing lines RW1 to RW4, respectively connected to the touch driving electrodes Tx1 to Tx6 and the touch sensing electrodes Rx1 to Rx4, are arranged in a non-display area NDA on the encapsulation film ENC of the display panel. Here, since display elements disposed below the encapsulation film ENC of the display area DA are not necessary in the area below the encapsulation film ENC of the non-display area NDA, in which the touch driving routing lines TW1 to TW6 and the touch routing sensing lines RW1 to RW4 (hereinafter, simply referred to as "touch routing lines") are arranged. Accordingly, a region from the non-display area NDA outside the display area DA toward an outer end of the display panel has a sharp gradient (e.g., a steep slope).

Accordingly, the touch routing lines disposed in the encapsulation film ENC of the non-display area NDA outside the display area DA have different parasitic capacitances according to their distance away from the display area DA. For example, when parasitic capacitance formed in the touch routing line TW5 positioned closest to the display area DA, among the touch routing lines disposed in the left non-display area of the display area, is C5 and parasitic capacitances formed in the touch routing lines TW3 and TW1 positioned to be sequentially away therefrom are C3 and C1, since the magnitude of capacitance is inversely proportional to the distance, a relative relationship of the magnitudes of the parasitic capacitances formed in the touch routing lines TW5, TW3, and TW1 is C5<C3<C1 (e.g., C1>C3>C5).

Therefore, in the related art display apparatus including a touch sensor, the parasitic capacitances between the touch routing lines are uneven due to a step difference depending on the positions of the touch routing lines, which degrades touch precision.

In addition, the related art display apparatus including a touch sensor must have additional area for arranging the touch routing lines in the left and/or right non-display areas, leading to a problem in that the non-display area is increased.

Further, in the related art display apparatus including a touch sensor, since the touch routing lines must extend from the touch electrodes to one end of the display panel to connect to the touch driving circuit, the length of the lines is increased, which leads to increased resistance and causes signal delay.

SUMMARY OF THE INVENTION

An aspect of the disclosure provides a display apparatus having a touch screen, which has enhanced touch precision by making differences in parasitic capacitance between touch routing lines minimum and eliminates signal delay due to an increase in a non-display area for touch routing lines and a length of lines.

According to a first aspect of the disclosure, a display apparatus having a touch screen includes: a display panel including a display area with pixels and a non-display area outside of the display area; a plurality of first touch electrodes in the display area of the display panel; a plurality of second touch electrodes crossing over the plurality of first touch electrodes in the display area of the display panel and electrically isolated from the plurality of first touch electrodes; a gate driver disposed in the non-display area of the display panel and configured to generate gate signals sequentially supplied to the pixels; a switching unit disposed in the non-display area of the display panel and configured to be controlled based on the gate signals; at least one touch signal supply line disposed in the non-display area of the display panel and configured to supply a touch driving signal to the switching unit; a plurality of first touch routing lines disposed in the non-display area of the display panel and configured to receive the touch driving signal from the switching unit and supply the touch driving signal to the plurality of first touch electrodes; and a plurality of second touch routing lines disposed in the non-display area of the display panel and configured to sense the plurality of second touch electrodes.

According to a second aspect of the disclosure, a display apparatus having a touch screen includes: a substrate including a display area and a non-display area outside of the display area; a thin film transistor (TFT) disposed in the non-display area of the substrate, in which the TFT includes a semiconductor layer, a gate electrode, a first electrode and a second electrode; a touch signal supply line disposed in the non-display area on an interlayer insulating film covering the gate electrode of the TFT, the touch signal supply line is connected to the first electrode of the TFT; a first touch routing line disposed in the non-display area on the interlayer insulating film, spaced apart from the touch signal supply line, and connected to the second electrode of the TFT; and a first touch electrode and a second touch electrode extending to the non-display area from the display area on a protective film covering the TFT, the touch signal supply line, and the first touch routing line, in which the first touch electrode is arranged along a first direction and the second touch electrode is arranged along a second direction crossing the first direction, and the first touch electrode is electrically isolated from the second touch electrode.

According to a third aspect of the disclosure, a display apparatus having a touch screen includes: a display panel including a display area and a non-display area; a plurality of first touch electrodes; a plurality of second touch electrodes; a switching unit disposed in the non-display area of the display panel; at least one touch signal supply line disposed in the non-display area of the display panel and configured to supply a touch driving signal to the switching unit; a plurality of first touch routing lines disposed in the non-display area of the display panel and configured to receive the touch driving signal from the switching unit and supply the touch driving signal to the plurality of first touch electrodes; and a plurality of second touch routing lines disposed in the non-display area of the display panel and configured to sense the plurality of second touch electrodes, in which the plurality of first touch routing lines extend along a different direction than the at least one touch signal supply line, and each of the plurality of first touch routing lines has substantially a same length in the non-display area.

According to the display apparatus having a touch screen of the disclosure, since the first touch routing lines connected to the first touch electrodes are disposed under the first touch electrode, all the first touch routing lines have substantially the same length in the non-display area and are supplied with a touch driving signal through the touch signal supply line positioned in a direction crossing over the first touch routing lines. Thus, non-uniformity of parasitic capacitance due to a step coverage based on positions of the touch routing lines can be prevented to enhance touch precision and prevent signal delay due to an increase in length of the first touch routing line.

Also, since only one or a few touch signal supply lines supplying a touch driving signal can be used, there is no need to dispose additional vertical portions (e.g., portions of the first touch routing lines arranged in a direction parallel to the data lines) of the first touch routing lines to be formed to correspond to the first touch electrodes in the non-display area, significantly reducing an increase in the non-display area.

BRIEF DESCRIPTION OF DRAWINGS

The above and other aspects, features, and advantages of the disclosure will be more clearly understood from the following detailed description taken in conjunction with the accompanying drawings, in which.

DETAILED DESCRIPTION

Figure 1:
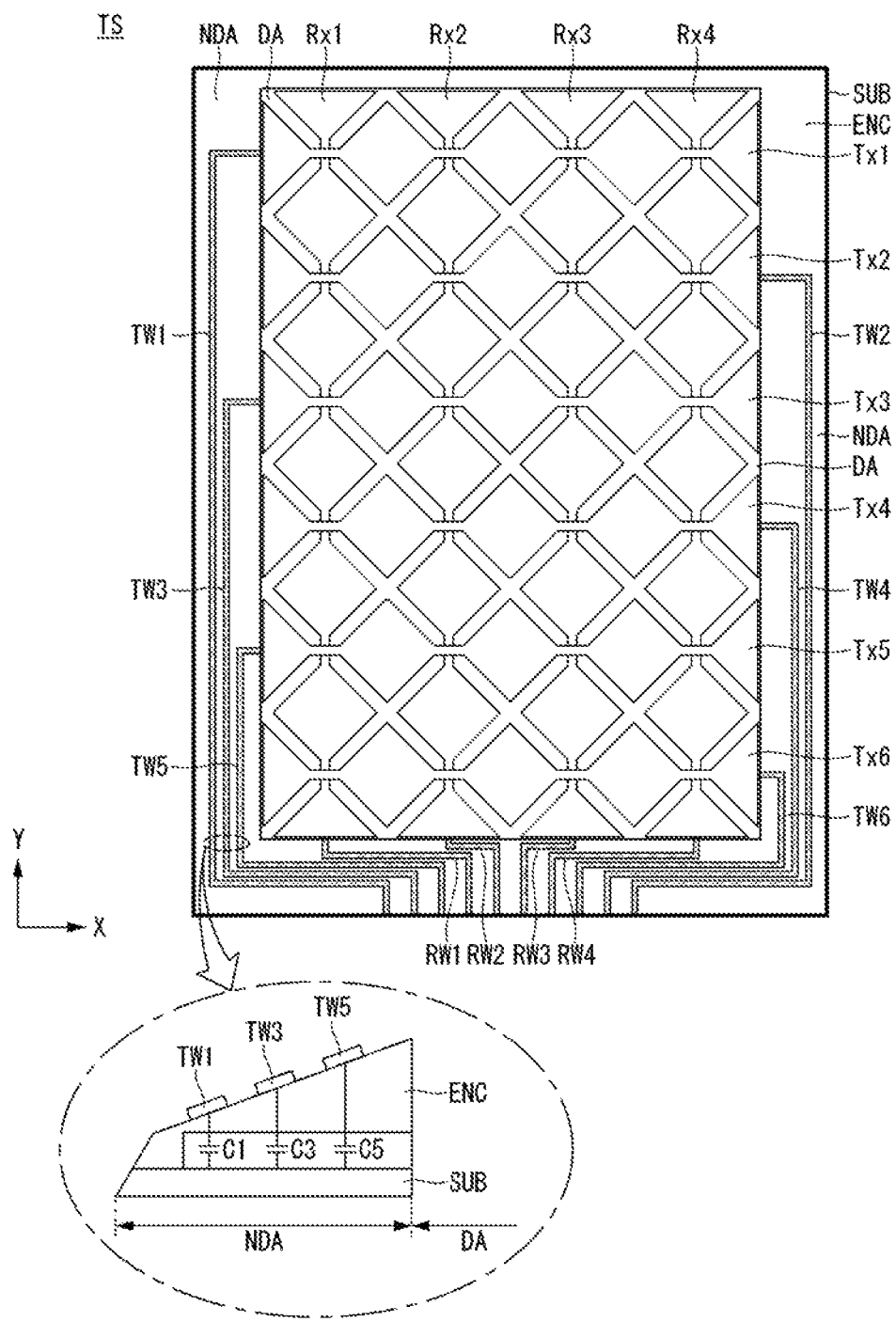
FIG. 1 is a view illustrating a problem of a related art display apparatus having a touch screen.

Advantages and features of the disclosure, and implementation methods thereof will be clarified through the following embodiments described with reference to the accompanying drawings. The disclosure may, however, be embodied in different forms and should not be construed as limited to the embodiments set forth herein. Rather, these embodiments are provided so that this disclosure will be thorough and complete, and will fully convey the scope of the disclosure to those skilled in the art. Further, the disclosure is only defined by scopes of claims.

The shapes, sizes, ratios, angles, numbers and the like disclosed in the drawings for describing the embodiments of the disclosure are illustrative and are not limited to those illustrated in the disclosure. Like reference symbols refer to like elements throughout the specification. Further, in the description of the disclosure, detailed description of known related arts will be omitted if it is determined that the gist of the disclosure may be unnecessarily obscured. Where the terms "comprises," "having," "including," and the like are used in this disclosure, other portions may be added as long as "only" is not used. Unless the context clearly dictates otherwise, including the plural unless the context clearly dictates otherwise.

In construing an element, the element is construed as including an error range although there is no explicit description.

In describing a position relationship, for example, when two portions are described as "on," "above," "below," or "on the side," one or more other portions may be positioned between the two portions unless "immediately" or "directly" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the disclosure.

In this disclosure, a pixel circuit and a gate driver formed on a substrate of a display panel can be implemented by a thin film transistor (TFT) having a p-type metal oxide semiconductor field effect transistor (MOSFET) structure, but the technical idea of the disclosure is not limited thereto. The TFT is a three-electrode element including a gate, a source, and a drain. The source is an electrode supplying a carrier to the transistor. In the TFT, carriers start to flow from the source. The drain is an electrode through which the carrier exits the TFT. That is, in the MOSFET, the carriers flow from the source to the drain. In the situation of a p-type TFT (PMOS), since the carrier is a hole, a source voltage is higher than a drain voltage so that holes may flow from the source to the drain. In the p-type TFT, since the holes flow from the source to the drain, current flows from the source to the drain. It should be noted that the source and drain of the MOSFET are not fixed. For example, the source and drain of the MOSFET may be changed depending on an applied voltage. Therefore, in descriptions of an embodiment of the disclosure, any one of the source and the drain may be referred to as a first electrode and the other of the source and the drain may be referred to as a second electrode.

Features of various embodiments of the disclosure can be partially or overall coupled to or combined with each other and can be variously inter-operated with each other and driven technically as those skilled in the art can sufficiently understand. The embodiments of the disclosure can be performed independently from each other or can be performed together in co-dependent relationship.

Hereinafter, a display apparatus including a touch screen according to an embodiment of the disclosure will be described with reference to the accompanying drawings. Like reference symbols throughout the specification denote substantially identical components. In the following description, when the detailed description of the relevant known function or configuration is determined to unnecessarily obscure points of the disclosure, the detailed description will be omitted or briefly described.

Hereinafter, a display apparatus having a touch screen according to an embodiment of the disclosure will be described with reference to FIGS. 2 to 7.

Figure 2:
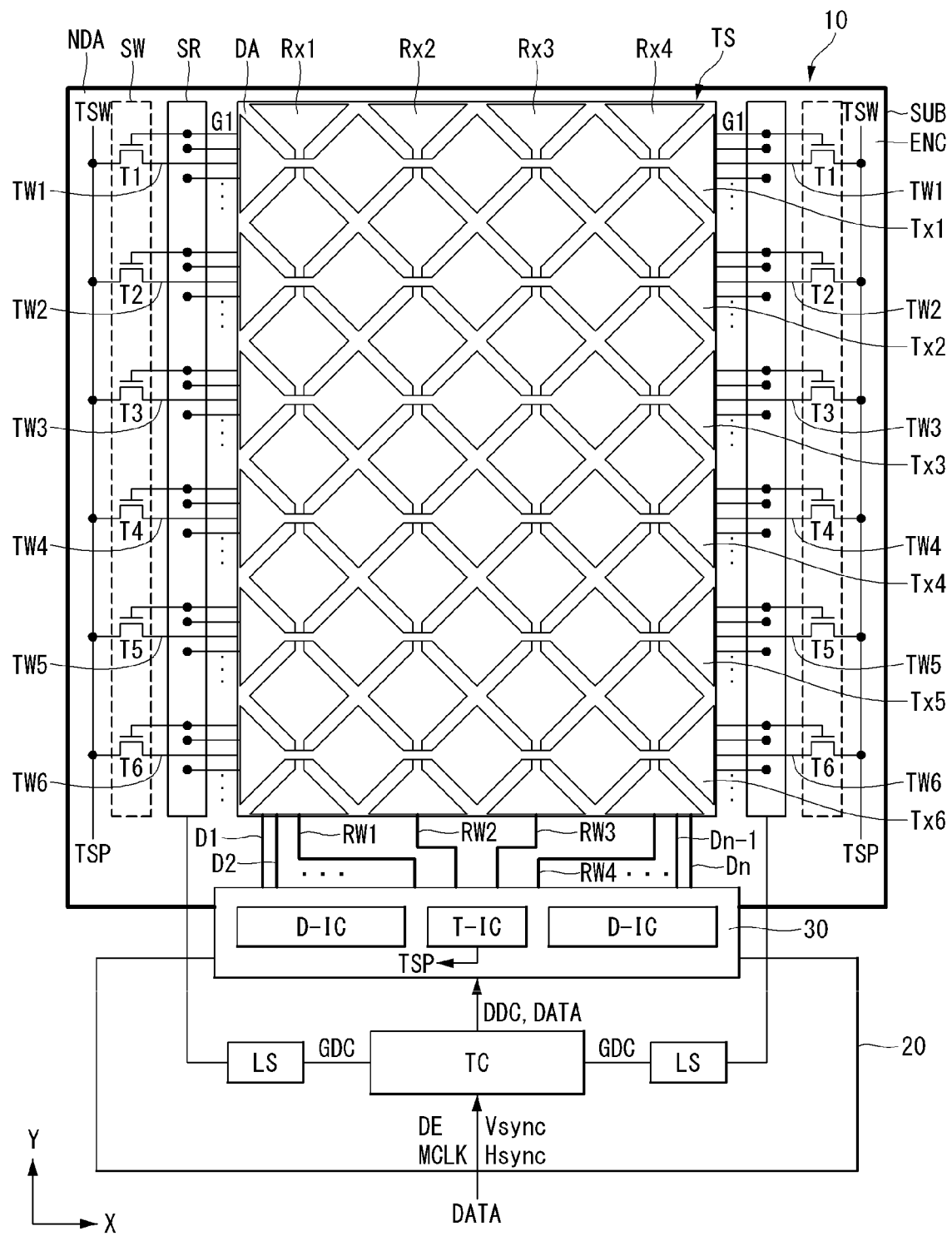
FIG. 2 is a plan view illustrating a display apparatus having a touch screen according to an embodiment of the disclosure.
Figure 3:
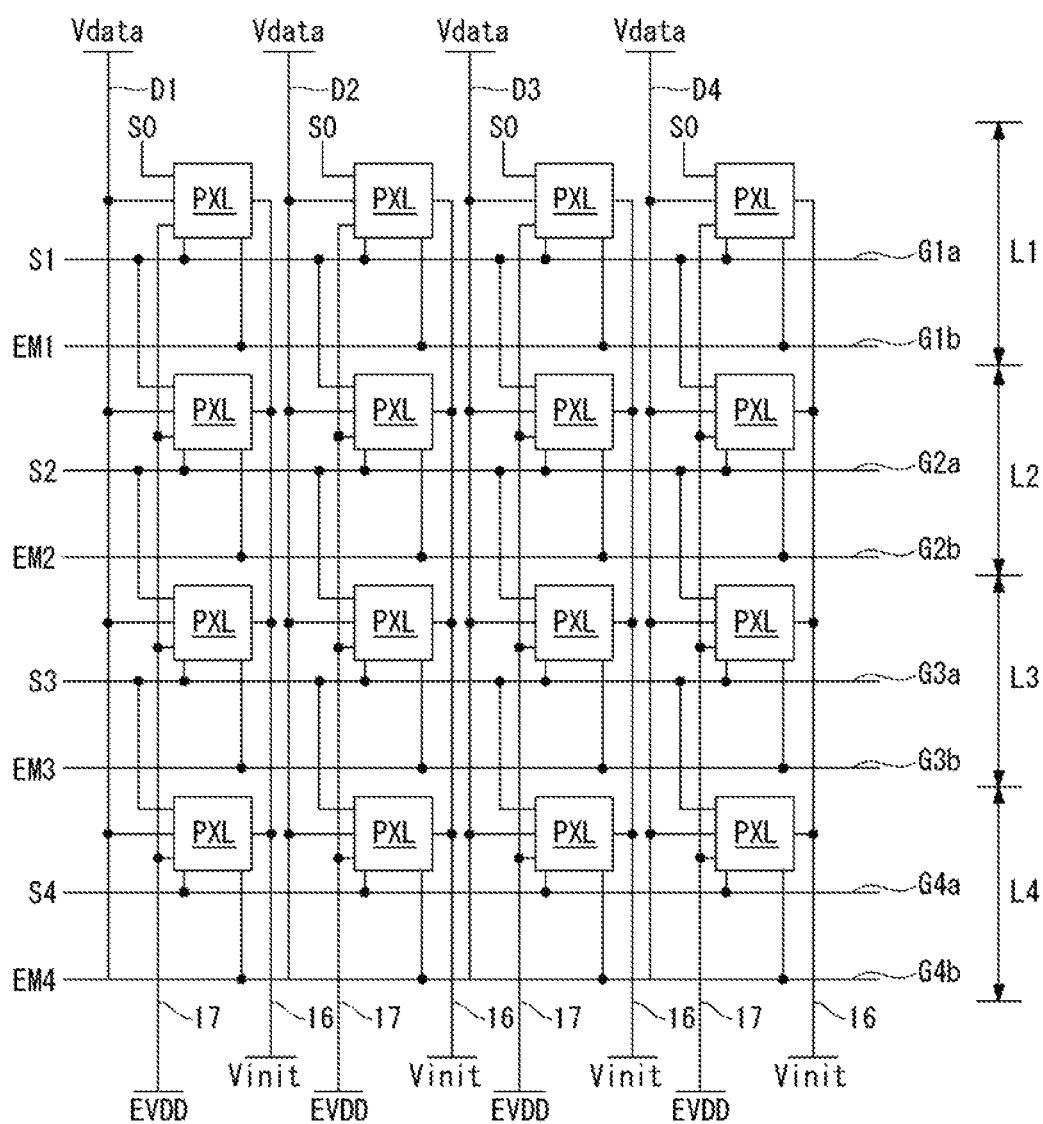
FIG. 3 is a view schematically illustrating a pixel array of a display panel illustrated in FIG. 2 according to an embodiment of the disclosure.
Figure 4:
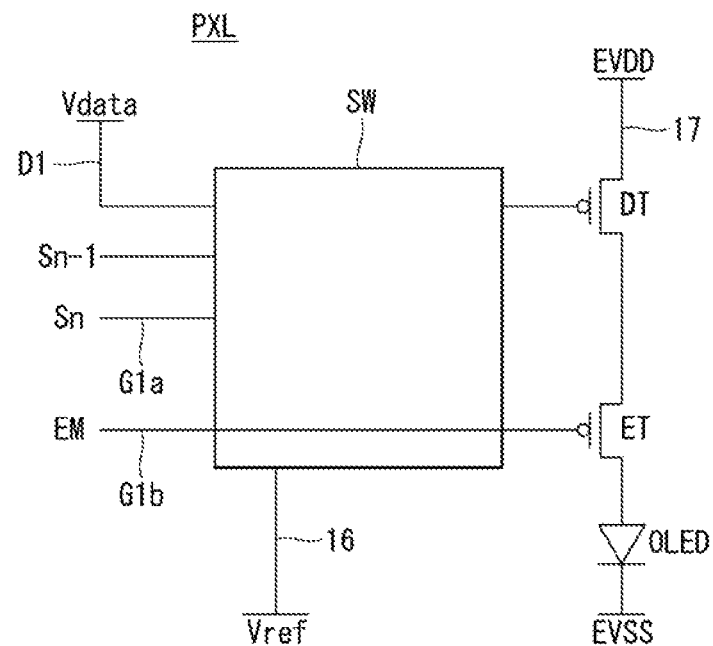
FIG. 4 is a view schematically illustrating a one-pixel circuit included in a pixel array of the display panel of FIG. 2 according to an embodiment of the disclosure.
Figure 5:
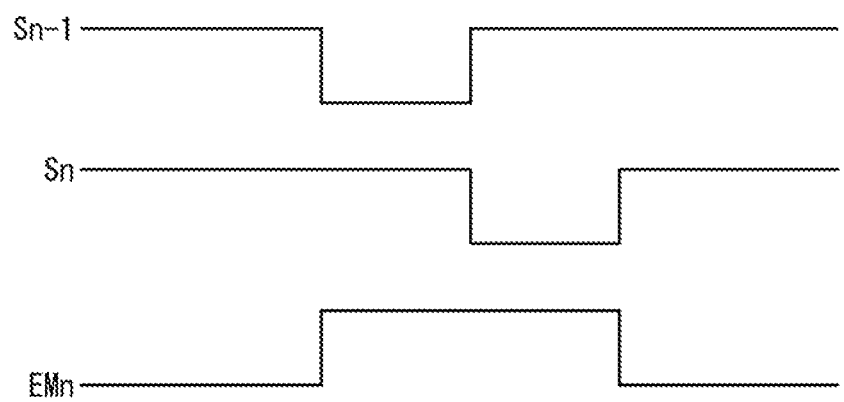
FIG. 5 is a waveform view illustrating an example of a gate signal including a scan signal and an emission signal applied to the pixel circuit of FIG. 4 according to an embodiment of the disclosure.
Figure 6:
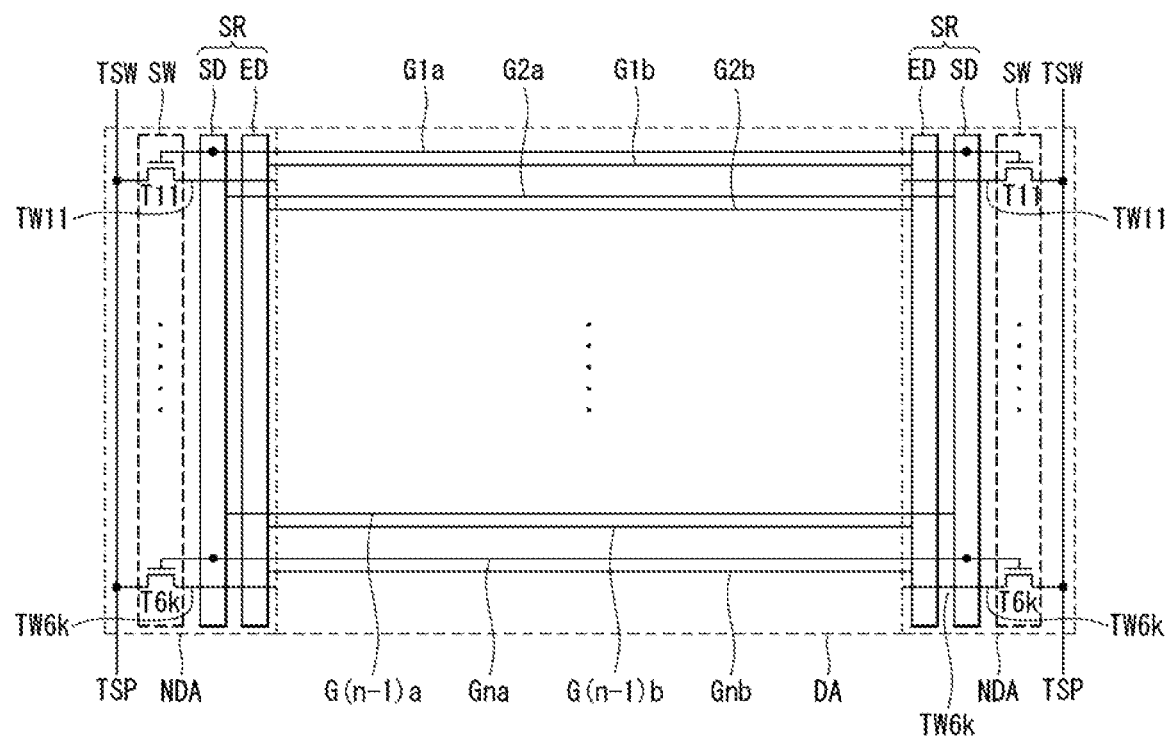
FIG. 6 is a view illustrating a configuration of controlling supply of a touch driving signal by a scan driver included in a gate driver of FIG. 2 according to an embodiment of the disclosure.
Figure 7:
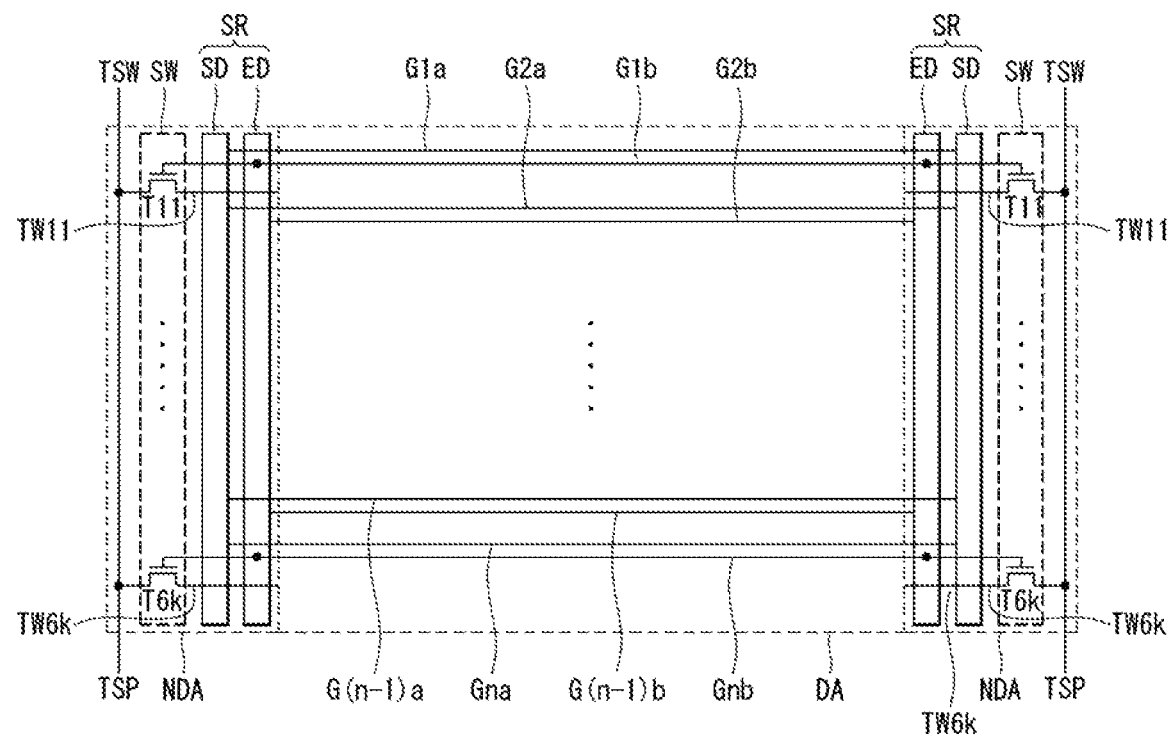
FIG. 7 is a view illustrating a configuration of controlling supply of a touch driving signal by an emission driver included in the gate driver of FIG. 2 according to an embodiment of the disclosure.

FIG. 2 is a plan view schematically illustrating a display apparatus having a touch screen according to an embodiment of the disclosure. FIG. 3 is a view schematically illustrating a pixel array of a display panel illustrated in FIG. 2. FIG. 4 is a view schematically illustrating a one-pixel circuit included in a pixel array of the display panel of FIG. 2. FIG. 5 is a waveform view illustrating an example of a gate signal including a scan signal and an emission signal applied to the pixel circuit of FIG. 4. FIG. 6 is a view illustrating a configuration of controlling supply of a touch driving signal by a scan driver included in a gate driver of FIG. 2. FIG. 7 is a view illustrating a configuration of controlling supply of a touch driving signal by an emission driver included in the gate driver of FIG. 2.

Referring to FIG. 2, a display apparatus according to an embodiment of the disclosure includes a display panel 10, a touch screen TS, a data driver D-IC, a gate driver including LS and SR, a touch driver T-IC, a timing controller TC, and the like.

The display panel 10 includes a display area DA displaying information and a non-display area NDA in which information is not displayed.

The display area DA is an area in which an input image is displayed, and a pixel array having a plurality of pixels arranged in a matrix form is disposed. The pixel array disposed in the display area DA includes a plurality of data lines D1 to Dm and a plurality of gate lines G1 to Gn arranged to cross over each other and pixels disposed in a matrix form at areas defined by the crossings.

Referring to FIG. 3, the pixel array is provided in the display area DA of the display panel 10. The pixel array includes a plurality of horizontal pixel lines (e.g., L1 to L4). In each of the plurality of horizontal pixel lines L1 to L4, a plurality of pixels PXL horizontally adjacent to each other and commonly connected to gate lines G1a, G1b; G2a, G2b; G3a, G3b; and G4a, G4b are disposed.

Here, each of the horizontal pixel lines L1 to L4 refers to a set of pixels of one line portion implemented by the horizontally neighboring pixels PXL, rather than a physical signal line. The pixel array can include a first power line 16 supplying a reference voltage Vref to the pixels PXL and a second power line 17 supplying a high potential source voltage EVDD to the pixels PXL. Further, the pixels PXL can be further connected to a low potential source voltage EVSS (see FIG. 4).

The configuration of the gate lines G1a, G1b, G2a, G2b, G3a, G3b, G4a, and G4b may vary according to pixel circuits. The gate lines include first gate lines G1a to G4a to which scan signals S1 to S4 are respectively supplied, and second gate lines G1b to G4b to which emission signals EM1 to EM4 are respectively supplied. Also, in a n-th horizontal pixel line Ln, in addition to a n-th scan signal Sn and an n-th emission signal EMn allocated to an n-th horizontal pixel line Ln, an (n−1)th scan signal Sn−1 allocated to an (n−1)th horizontal pixel line Ln−1 is further supplied to each pixel PXL arranged in the n-th horizontal pixel line Ln.

Here, the first gate lines G1a to G4a transfer scan signals output from a scan driver of the gate driver, which will be described later, so that they may be referred to as scan lines G1a to G4a. Also, the second gate lines G2a to G4b transfer emission signals output from an emission driver of the gate driver, and thus, they may be referred to as emission lines G1b to G4b (see FIG. 4).

Each of the pixels PXL can be any one of a red pixel, a green pixel, a blue pixel, and a white pixel. The red pixel, the green pixel, the blue pixel, and the white pixel can constitute one unit pixel to realize various colors. A color realized in the unit pixel can be determined according to emission ratios of the red pixel, the green pixel, the blue pixel, and the white pixel. In some situations, white pixels may be omitted. Each of the pixels PXL can be connected to the data lines D1, D2, D3, and D4, the first gate lines G1a, G2a, G3a, and G4a, the second gate lines G1b, G2b, G3b, and G4b, the first power line 16, the second power line 17, and the like.

The pixel circuit can have various configurations. For example, as illustrated in FIG. 4, each of the pixels PXL can include an organic light emitting diode OLED, a switching circuit SW for programming a gate-source voltage of a driving TFT DT, the driving TFT DT for controlling a driving current flowing in the organic light emitting diode OLED according to the gate-source voltage, and an emission TFT ET turned on or off according to an emission signal EM to determine an emission timing of the OLED. Here, the switching circuit SW can include a plurality of switching TFTs, at least one capacitor, and the like, and can be variously modified according to product models and specifications. The TFTs included in each of the pixels PXL can be implemented as PMOS type LTPS TFTs, thus achieving desired response characteristics. However, the technical idea of the disclosure is not limited thereto. For example, at least one of the TFTs can be realized as an NMOS type oxide TFT having good off-current characteristics, and the other TFTs can be realized as PMOS type LTPS TFTs having good response characteristics.

Each of the pixels PXL can perform an initialization operation, a programming operation, and an emission operation according to the scan signals Sn−1 and Sn and the emission signal EMn, as illustrated in FIG. 5. For example, the switching circuit SW initializes specific nodes in the switching circuit SW to the reference voltage Vref and programs the gate-source voltage of the driving TFT DT based on a data voltage Vdata to allow a driving current corresponding to the gate-source voltage to flow between the source and the drain of the driving TFT DT, thereby causing the organic light emitting diode OLED to emit light by the driving current.

The touch screen TS is formed to correspond to the display area DA of the display panel 10 in which the pixel array is disposed. The touch screen TS can include first touch electrodes Tx1 to Tx6 and second touch electrodes Rx1 to Rx4 disposed on an encapsulation film ENC of the display panel 10.

In this example, the touch screen TS is an on-cell type, but the disclosure is not limited thereto, and the disclosure can also be applied to an add-on type or an integrated type. Accordingly, examples of the touch screen should not be limited to the on-cell type and can include the integrated type, as well as the add-on type.

The touch screen TS includes a plurality of first touch electrodes Tx1 to Tx6 and a plurality of second touch electrodes Rx1 to Rx4 arranged to cross over each other.

The plurality of first touch electrodes Tx1 to Tx6 are arranged in parallel to each other in a first direction (e.g., a y-axis direction) on the encapsulation film ENC disposed in the display area DA of the display panel 10 and extend in a second direction (e.g., an x-axis direction) crossing over the first direction. Each of the plurality of first touch electrodes Tx1 to Tx6 has a structure in which a plurality of first touch electrode patterns having a triangular, square, rhombic, or polygonal shape are connected in series, but the disclosure is not limited thereto.

The plurality of second touch electrodes Rx1 to Rx4 are arranged on the encapsulation film ENC arranged in the display area DA of the display panel S10 in parallel with each other in the second direction and extend in the first direction. The plurality of second touch electrodes Rx1 to Rx4 can have a structure in which a plurality of second touch electrode patterns having a triangular, square, rhombic, or polygonal shape are connected in series, like the first touch electrodes, but the disclosure is not limited thereto. For example, the shape of the first and second electrode patterns can have various other shapes in order to improve touch recognition.

The first touch electrodes Tx1 to Tx6 and the second touch electrodes Rx1 to Rx4 can have a mesh pattern formed of a transparent conductive material, such as ITO, IZO or GZO, or a metal material, such as Al, AlNd, Mo, Ti, MoTi, Cu, Ni, Cr, Ag, Au, or Ag-based alloys.

The touch screen TS can include an insulating layer entirely between the first touch electrodes Tx1 to Tx6 and the second touch Rx1 to Rx4, or insulating patterns disposed only at the crossings between the first touch electrodes Tx1 to Tx6 and the second touch electrodes Rx1 to Rx4, in order to maintain a state in which the plurality of first touch electrodes Tx1 to Tx6 and the plurality of second touch electrodes Rx1 to Rx4 are electrically insulated from each other.

The non-display area NDA of the display panel 10 is an area where the gate driver, the switching circuit SW, various signal lines, and power lines can be arranged.

The gate driver can be a type in which a chip-on-film having a gate IC mounted thereon is disposed on one side of the display panel 10 or a GIP type in which a gate IC is formed on the display panel 10. In this disclosure, the GIP type gate driver will be described as an example.

As illustrated in FIG. 2, the gate driver can be realized as a gate driver in panel (GIP) type including a level shifter LS mounted on a source printed circuit board (PCB) 20 and a shift register SR formed in the non-display area NDA and receiving signals supplied from the level shifter LS.

The level shifter LS boosts a transistor-transistor-logic (TTL) level voltage of a gate timing control signal GDC input from the timing controller TC to a gate OFF voltage and a gate ON voltage and supplies the boosted voltage to the gate driver 130. The gate timing control signal GDC can include an external start signal, a clock signal, and the like.

The shift register SR is operated in accordance with the gate timing control signal GDC input from the level shifter LS to generate a gate signal. Also, the shift register SR sequentially supplies the gate signal to the gate lines G1 to Gn.

As illustrated in FIGS. 6 and 7, the shift register SR is provided on both sides of the display panel 10 in a double bank manner to minimize signal distortion according to load deviation of each position. The shift register SR includes a scan driver SD generating scan signals Sn−1 and Sn and an emission driver ED generating an emission signal EMn as illustrated in FIG. 5.

The scan driver SD can supply the scan signals Sn−1 and Sn to the first gate lines G1a to Gna connected to the pixels PXL in a line sequential manner. The emission driver ED can supply the emission signal EMn to the second gate lines G1b to Gnb connected to the pixels PXL in a line sequential manner. The scan driver SD and the emission driver ED can be implemented by a plurality of stages.

The switching circuit SW is disposed adjacent to the shift register SR of the gate driver. The switching circuit SW includes touch signal switching TFTs T1 to T6 corresponding to the scan lines G1a to Gna or the emission lines G1ba to Gnb of the shift register SR, respectively.

Referring back to FIG. 2, the data driver includes at least one data IC D-IC. The data driver can include at least one data IC D-IC mounted therein and include a chip-on film 30 having one side connected to one end of a source printed circuit board (PCB) 20 and the other side adhered to the non-display area NDA of the display panel 10.

The data driver D-IC receives image data DATA from the timing controller TC. In response to a source timing control signal DDC from the timing controller TC, the data driver D-IC converts image data DATA into gamma compensation voltage to generate a data voltage Vdata and supplies the data voltage Vdata to the data lines D1 to Dn of the display panel 10 in synchronization with a scan signal SCAN. The data driver D-IC can be connected to the data lines of the display panel 10 through a chip-on-glass (COG) process or a tape automated bonding (TAB) process.

The timing controller TC can be connected to an external host system through various known interface schemes. The timing controller TC receives image data DATA from the host system. The timing controller TC can correct the image data DATA to compensate for luminance deviation due to a difference in driving characteristics of the pixels PXL and transmit the corrected image data to the data driver D-IC. In the example of FIG. 2, two data drivers D-IC are illustrated, but the disclosure is not limited thereto and one or three or more data drivers can be realized. In addition, the data driver can be integrated with the timing controller TC and mounted on the display panel 10.

The timing controller TC can receive timing signals, such as a vertical synchronization signal Vsync, a horizontal synchronization signal Hsync, a data enable signal DE, a main clock MCLK, and the like, from the host system, and generate a gate timing control signal GDC and a source timing control signal DDC based on the timing signal.

The touch driver can be implemented as a touch IC T-IC mounted on the chip-on film 30. However, the disclosure is not limited thereto, and the touch IC T-IC can be integrated as one chip form together with the data IC D-IC.

As illustrated in FIG. 2, at least one touch signal supply line TSW for supplying a touch driving signal TSP supplied from the touch IC T-IC to the switching circuit SW is disposed in the non-display area NDA of the display panel 10. In the embodiment of FIG. 2, it is illustrated that a touch driving signal TSP is supplied from the touch IC T-IC, but the disclosure is not limited thereto, and the touch driving signal TSP can be supplied through the data IC D-IC, the timing controller TC or a separate touch driving signal generating device.

In the non-display area NDA of the display panel 10, the first touch routing lines TW1 to TW6 connecting one ends of the plurality of first touch electrodes Tx1 to Tx6 and the touch signal switching TFTs T1 to T6 of the switching circuit SW are disposed.

Referring to FIG. 2, one ends of the plurality of first touch routing lines TW1 to TW6 are connected to the plurality of first touch electrodes Tx1 to Tx6, and other ends of the plurality of first touch routing lines TW1 to TW6 are connected to the corresponding touch signal switching TFTs T1 to T6 of the switching circuit SW.

As illustrated in FIG. 2, in the non-display area NDA of the display panel 10, a plurality of second touch routing lines RW1 to RW4 connecting one ends of the plurality of second touch electrodes Rx1 to Rx4 and the touch IC T-IC are arranged.

Next, a configuration of supplying a touch driving signal TSP to the first touch electrodes Tx1 to Tx6 acting as touch driving electrodes will be described with reference to FIGS. 6 and 7. FIG. 6 illustrates an example in which scan signals output from the scan driver SD of the shift register SR act as control signals of the switching circuit SW, and FIG. 7 illustrates an example in which emission signals output from the emission driver ED of the shift register SR act as control signals of the switching circuit SW. Accordingly, since the components of FIGS. 6 and 7 are same or similar, FIGS. 6 and 7 will be described in conjunction with each other.

The touch signal supply lines TSW are arranged in a direction crossing the scan lines G1a to Gna and the emission lines G1b to Gnb, and having one ends connected to a component supplying the touch driving signal TSP and another ends connected to the source electrodes of the touch signal switching TFTs T1 to T6 of the switching circuit SW.

The first touch routing lines TW1 to TW6 are arranged in parallel with the scan lines G1a to Gna and the emission lines G1b to Gnb, and having one ends connected to the drain electrodes of the touch signal switching TFTs T1 to T6 and another ends connected to the first touch electrodes Tx1 to Tx6.

The scan lines G1a to Ga connected to an output terminal of the scan driver SD and extending to the pixel array of the display area DA are also connected to the gate electrodes of the touch signal switching TFTs T1 to T6 of the switching circuit SW of the non-display area NDA. Alternatively, the emission lines G1b to Gnb connected to an output terminal of the emission driver ED and extending to the pixel array of the display area DA can be connected to the gate electrodes of the touch signal switching TFTs T1 to T6 of the switching circuit SW of the non-display area NDA.

According to the above-described configuration, the touch driving signal TSP is sequentially supplied to the first touch electrodes Tx1 to Tx6 through the first touch routing lines TW1 to TW6 by the touch signal switching TFTs T1 to T6 of the switching circuit SW turned on or turned off by a scan signal output from the scan driver SD or an emission signal output from the emission driver ED.

In FIG. 2, it is illustrated that the number of touch signal switching TFTs T1 to T6 of the switching circuit SW is determined to correspond to the number of the first touch electrodes Tx1 to Tx6 but the disclosure is not limited thereto. For example, as illustrated in FIGS. 6 and 7, the touch signal switching TFTs T11 to T6$k$ of the switching circuit SW can be configured to be controlled by the plurality of first gate lines G1$a$ to Gna or the plurality of second gate lines G1$b$ to Gnb, respectively, and, in the plurality of first touch routing lines TW11 to TW6$k$ respectively connected to the touch signal switching TFTs T11 to T6$k$, the first touch routing lines TW11 to TW6$k$ are grouped to 6 groups (e.g., TW11 to TW1$k$, TW21 to TW2$k$, . . . , TW61 to TW6$k$) including k number of first touch routing lines (here, k is a natural number which is smaller than the number of scan lines or emission lines and which satisfies a relationship of k=n/6, herein, n is the number of scan lines or emission lines and 6 is the number of first touch electrodes), to be connected to each of the plurality of first touch electrodes Tx1 to Tx6.

Hereinafter, the relationship among the first touch electrodes Tx1 to Tx6, the first touch routing lines, and the switching circuit will be described in more detail with reference to FIG. 8.

Figure 8:
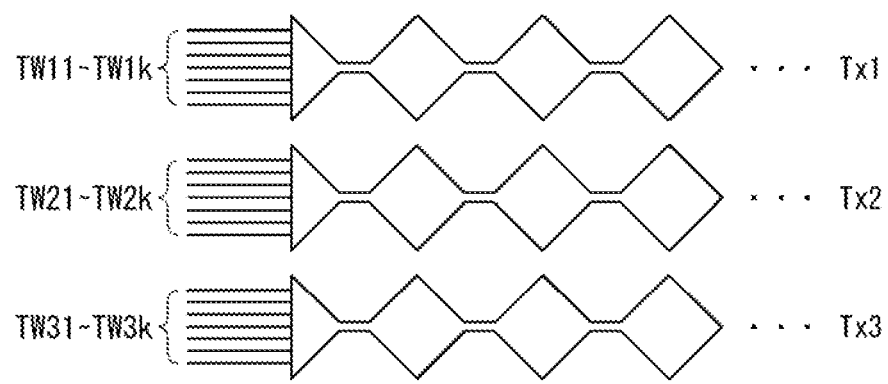
FIG. 8 is a view schematically illustrating a relationship between first touch routing lines supplying a touch driving signal and first touch electrodes according to an embodiment of the disclosure.

FIG. 8 is a view schematically illustrating a relationship between the first touch routing lines supplying a touch driving signal and first touch electrodes.

Referring to FIG. 8, k number of first touch routing lines TW11 to TW1$k$, TW21 to TW2$k$, TW31 to TW3$k$, . . . can be connected to the first touch electrodes Tx1, Tx2, Tx3, . . . disposed in each row of the display area DA. According to this configuration, k number of touch driving signals can be applied to one first touch driving electrode so that a touch can be sensed by accumulating signal variations based on a touch k times, increasing touch precision.

Next, referring to FIG. 9, an example of a situation where the touch driving signal TSP is supplied to the first touch electrodes Tx1, Tx2, Tx3 . . . by controlling a scan signal will be described in detail.

Figure 9:
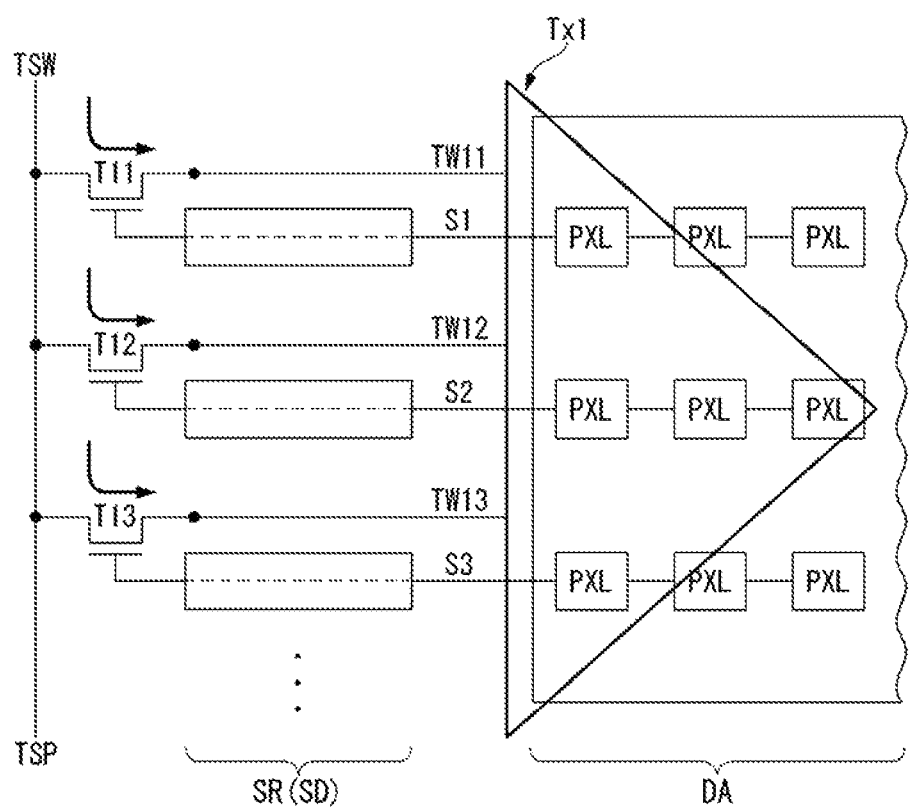
FIG. 9 is a view illustrating an example of a configuration of supplying a scan signal output from a gate driver to a touch array and a configuration of supplying a touch driving signal to first touch electrodes using a scan signal as a control signal according to an embodiment of the disclosure.

FIG. 9 is a circuit view illustrating a configuration of supplying scan signals S1, S2, S3, . . . output from the gate driver to the touch array and a configuration of supplying the touch driving signal TSP to the first touch electrodes Tx1, Tx2, Tx3, . . . .

Referring to FIG. 9, the scan signals S1, S2, S3, . . . sequentially output from the gate driver, that is, from the scan driver SD of the shift register SR, are supplied to pixels PXL of the pixel array disposed in the display area DA of the display panel. The scan signals S1, S2, S3, . . . are also supplied to the gate electrodes of the touch signal switching TFTs T11, T12, T13, . . . of the switching circuit SW disposed in the non-display area NDA of the display panel. Since the scan signals S1, S2, S3, . . . are sequentially supplied during one horizontal period, the touch signal switching TFTs T11, T12, T13, . . . are also sequentially turned on and off in synchronization with the scan signals S1, S2, S3, . . . . Accordingly, the touch driving signal TSP supplied through the touch signal supply line TSW is supplied to one first touch electrode (e.g., Tx1) through k number of first touch routing lines TW11 to TW1$k$. According to this configuration, since the k number of touch driving signals are input to one first touch electrode (e.g., Tx1), signal variations regarding each touch driving signal can be accumulated when a touch is sensed, increasing touch precision.

Next, a configuration in which a touch driving signal is supplied to the first touch electrodes Tx1, Tx2, Tx3, . . . by control of the emission signals EM1, EM2, EM3, . . . will be described with reference to FIG. 10.

Figure 10:
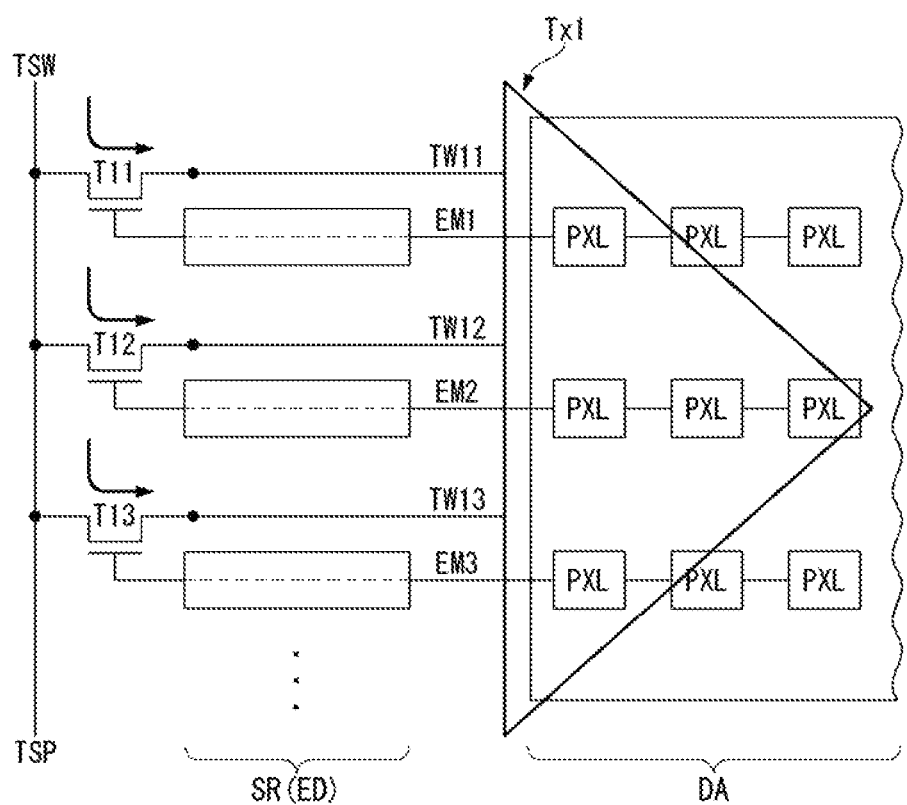
FIG. 10 is a view illustrating an example of a configuration of supplying an emission signal output from a gate driver to a touch array and a configuration of supplying a touch driving signal to first touch electrodes using an emission signal as a control signal according to an embodiment of the disclosure.

FIG. 10 is a view illustrating a configuration in which emission signals EM1, EM2, EM3, . . . output from the gate driver are supplied to the touch array and a configuration in which the touch driving signal TSP is supplied to the first touch electrodes, Tx1, Tx2, Tx3, . . . using the emission signals EM1, EM2, EM3, . . . as control signals.

Referring to FIG. 10, the emission signals EM1, EM2, EM3, sequentially output from the gate driver, that is, from the emission driver ED of the shift register SR are supplied to the pixels PXL arranged in the display area DA of the display panel. The emission signals EM1, EM2, EM3, . . . are also applied to the gate electrodes of the touch signal switching TFTs T11, T12, T13, . . . of the switching circuit SW disposed in the non-display area NDA of the display panel. Since the emission signals EM1, EM2, EM3, are sequentially supplied during one horizontal period, the touch signal switching TFTs T11, T12, T13, . . . are also sequentially turned on and off in synchronization with the scan signals S1, S2, S3, . . . the touch signal switching TFTs T11, T12, T13, . . . are also sequentially turned on and off in synchronization with the emission signals EM1, EM2, EM3, . . . . Accordingly, the touch driving signal TSP supplied through the touch signal supply line TSW is supplied to one first touch electrode (e.g., Tx1) through k number of first touch routing lines TW11 to TW1$k$. According to this configuration, since the k number of touch driving signals are input to one first touch electrode (e.g., Tx1), signal variations regarding each touch driving signal can be accumulated when a touch is sensed, increasing touch precision.

Figure 11:
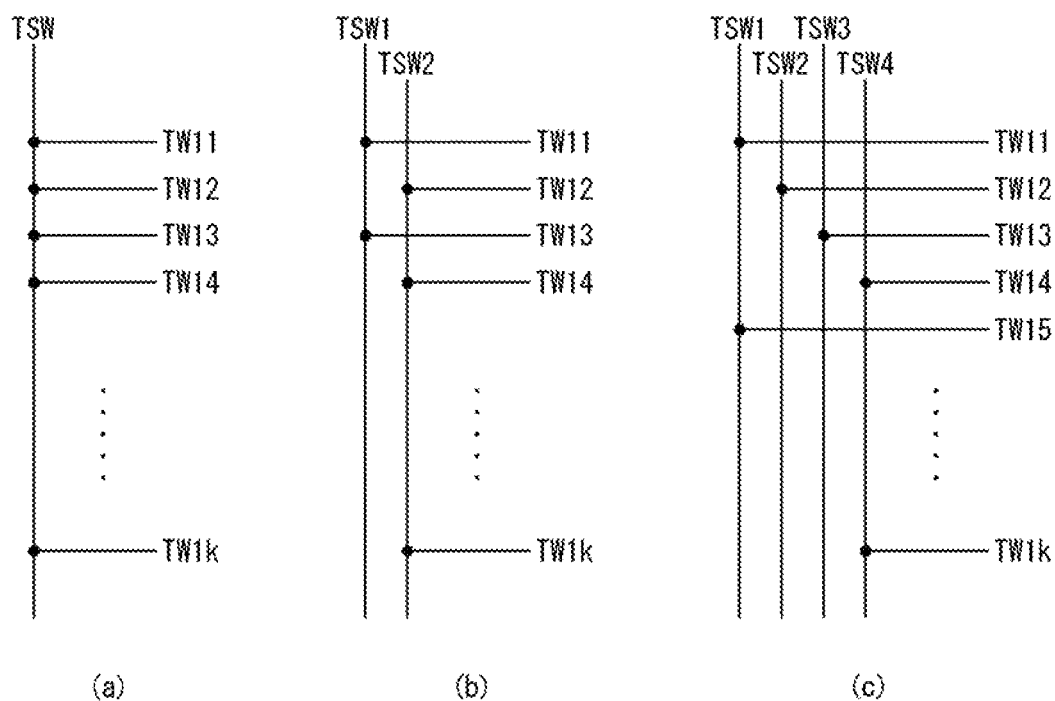
FIG. 11 is a view schematically illustrating various examples of configuration of touch signal supply lines, in which (a) illustrates an example of configuring one touch signal supply line, (b) illustrates an example of configuring two touch signal supply lines, and (c) illustrates an example of configuring four touch signal supply lines according to embodiments of the disclosure.

FIG. 11 is a view schematically illustrating various examples of configuration of touch signal supply lines, in which (a) illustrates an example of configuring one touch signal supply line, (b) illustrates an example of configuring two touch signal supply lines TSW1 and TSW2, and (c) illustrates an example of configuring four touch signal supply lines TSW1, TSW2, TSW3, and TSW4.

As illustrated in (a) of FIG. 11, in a situation where one touch signal supply line TSW1 is provided, odd-numbered first touch routing lines TW11, TW13, among k number of first touch routing lines (e.g., TW11 to TW1$k$) connected to one first touch electrode (e.g., Tx1), can output a high signal of a touch driving signal and even-numbered first touch routing lines TW12, TW14, . . . can output a low signal of a touch driving signal, and thus, a driving frequency for driving the first touch electrode can be reduced to half, compared with the situation of (b) of FIG. 11. Accordingly, the example of (a) of FIG. 11 can be used even when touch sensitivity is low, and since only one first touch routing line is used, an effect of minimizing a line region can be additionally obtained.

As illustrated in (b) of FIG. 11, in a situation where two touch signal supply lines TSW1 and TSW2 are provided, if the touch driving signal TSP is sequentially applied to the two touch signal supply lines TSW1 and TSW2, a high signal of the touch driving signal can be continuously output to two first touch routing lines among k number of first touch routing lines (e.g., TW11 to TW1$k$) connected to one first touch electrode (e.g., Tx1) at every one horizontal period, and thus, an effect of reducing a load of the touch signal supply line, as well as further increasing a touch sensing rate, may be obtained. Also, when only one signal among TSW1 and TSW2 is used, driving can be performed by reducing a frequency as illustrated in (a) of FIG. 11 (e.g., touch sensing of (b) can be performed twice as fast as the touch sensing of (a)).

As illustrated in (c) of FIG. 11, in a situation where four touch signal supply lines TSW1, TSW2, TSW3, and TSW4 are provided, if a touch driving signal TSP is sequentially supplied to the four touch signal supply lines TSW1, TSW2, TSW3, and TSW4 and a frequency is increased by two folds to have a high section at every ½ horizontal period, an effect of reducing a load of the touch signal supply line to ¼, as well as further increasing a touch sensing rate to double can be obtained (e.g., touch sensing of (c) can be performed twice as fast as the touch sensing of (b) and four times faster than the touch sensing of (a)).

Figure 12:
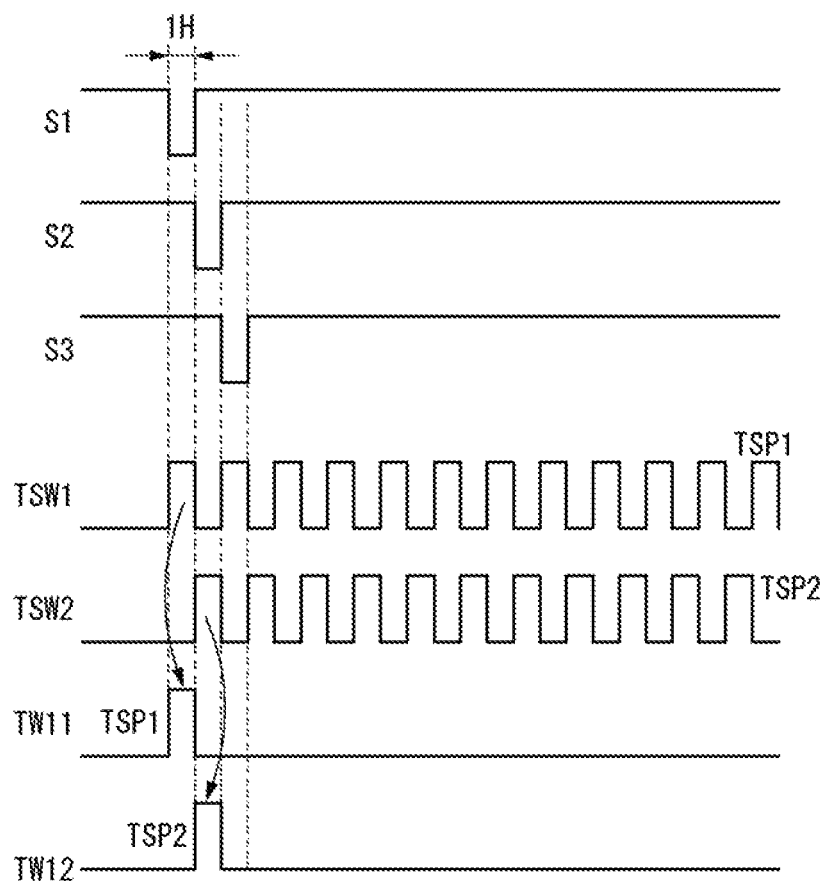
FIG. 12 is a view illustrating a scan signal supplied to touch signal switching thin film transistors (TFTs) of a switching unit and a touch driving signal supplied to a first touch routing line connected to one first touch electrode through a touch signal supply line in a situation where two touch signal supply lines are provided according to an embodiment of the disclosure.

Referring to FIG. 12, supplying the touch driving signal TSP to one first touch driving electrode (e.g., Tx1) by the scan signals S1, S2, S3, . . . in a situation where two touch signal supply lines TSW1 and TSW2 are provided will be described with reference to FIG. 12.

FIG. 12 is a timing diagram illustrating the scan signals S1, S2, S3, . . . supplied to the touch signal switching TFTs T11, T12, . . . of the switching circuit SW and the touch driving signals supplied to the first touch routing lines TW11 and TW12 connected to one first touch electrode (e.g., Tx1) through the touch signal supply lines TSW1 and TSW2, in situation where the two touch signal supply lines TSW1 and TSW2 are provided.

Referring to FIG. 12, when the scan signals S1, S2, S3, . . . of one horizontal period 1H are sequentially applied to the touch signal switching TFTs T11, T12, . . . , the touch signal switching TFTs T11, T12, . . . are turned on when the scan signals S1, S2, S3, . . . have a low level, and the touch driving signals TSP1 and TSP2 supplied to the touch signal supply lines TSW1 and TSW2 are shifted by the one horizontal period and respectively supplied to the odd-numbered first touch routing lines TW11 and TW13 and the even-numbered first touch routing lines TW12 and TW14.

Therefore, since the touch driving signal TSP is continuously supplied to one first touch electrode Tx1, while being shifted by one horizontal period, sensing can be performed a larger number of times for the same time, obtaining an effect of increasing touch precision.

Next, referring to FIG. 13, supplying the touch driving signal TSP to one first touch driving electrode (e.g., Tx1) by the emission signals EM1, EM2, EM3, . . . in a situation where two touch signal supplying lines TSW1 and TSW2 are provided will be described with reference to FIG. 13.

Figure 13:
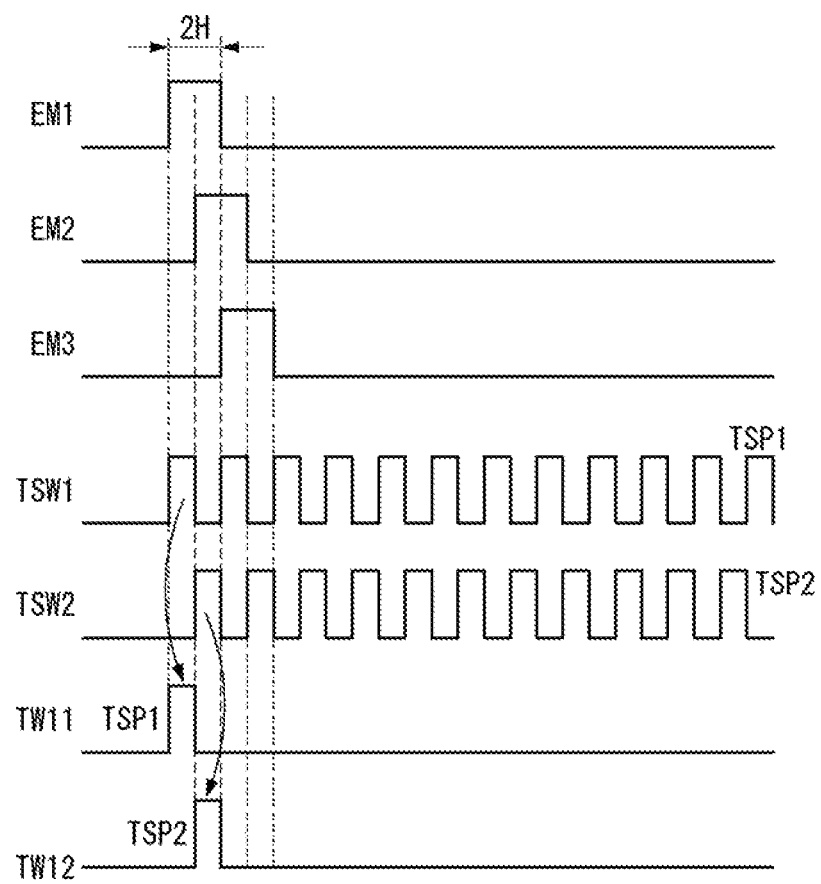
FIG. 13 is a view illustrating an example of a configuration of supplying an emission signal output from a gate driver to a touch array and a configuration of supplying a touch driving signal to first touch electrodes using an emission signal as a control signal according to an embodiment of the disclosure.

FIG. 13 is a timing diagram illustrating the emission signals EM1, EM2, EM3, . . . supplied to the touch signal switching TFTs T11, T12, T13, . . . of the switching circuit SW and the touch driving signals supplied to the first touch routing lines TW11 and TW12 connected to one first touch electrode (e.g., Tx1) through the touch signal supply lines TSW1 and TSW2, in a situation where the two touch signal supply lines TSW1 and TSW2 are provided.

Referring to FIG. 13, the emission signal EM1 supplied to the pixel electrodes of the previous horizontal line and the emission signal EM2 supplied to the pixels of the current horizontal line are shifted by one horizontal period and are supplied during two horizontal periods 2H. The touch signal switching TFTs T11, T12, . . . of the switching circuit SW are turned on when the emission signal has a high level. When the emission signals EM1, EM2, EM3 . . . of the two horizontal periods 2H are shifted by one horizontal period and sequentially applied to the touch signal switching TFTs T11, T12, . . . , the touch signal switching TFTs T11, T12, . . . are turned on when at least one of the two emission signals EM1, EM2, EM3, . . . has a high level, and the touch driving signals TSP1 and TSP2 supplied to the touch signal supply lines TSW1 and TSW2 are supplied to the odd-numbered first touch routing lines TW11 and TW13 and even-numbered first touch routing lines TW12 and TW14, respectively.

Therefore, since the touch driving signal TSP is continuously supplied to one first touch electrode Tx1, while being shifted by one horizontal period, sensing can be performed a larger number of times for the same time, obtaining an effect of increasing touch precision.

Next, a connection relationship between the first touch electrode and the first touch routing line will be described with reference to FIG. 14.

Figure 14:
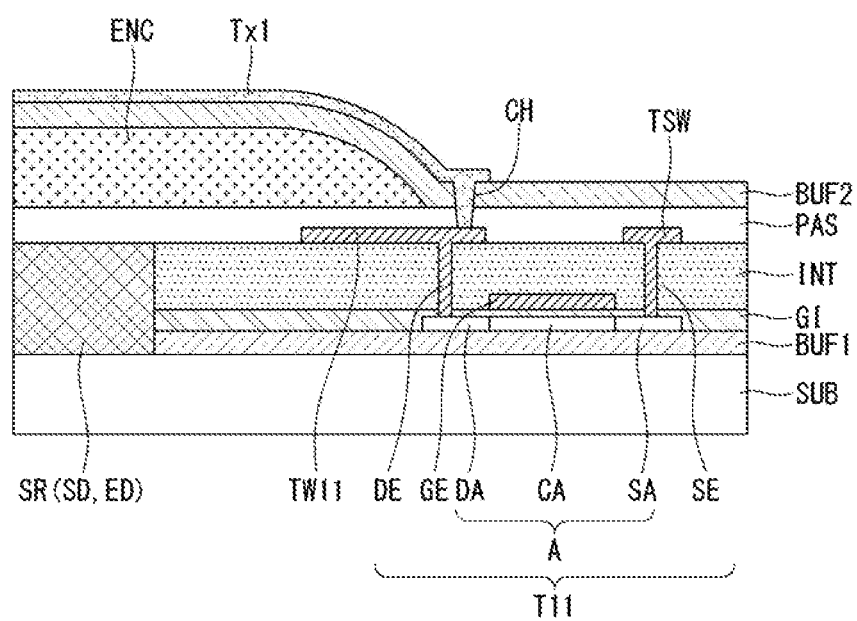
FIG. 14 is a cross-sectional view illustrating a connection relationship between a first touch routing line and a first touch electrode in a display panel of a display apparatus having a touch screen according to the embodiment of FIG. 2 according to an embodiment of the disclosure.

FIG. 14 is a cross-sectional view illustrating a connection relationship between a first touch routing line and a first touch electrode in a display panel of a display apparatus having a touch screen according to the embodiment of FIG. 2.

Referring to FIG. 14, a first buffer layer BUF1 having a single-layer structure or a multi-layer structure can be positioned on a substrate SUB of a display panel. The substrate SUB may be formed of a flexible translucent material. In a situation where the substrate SUB is formed of a material such as polyimide, the first buffer layer BUF1 can be formed as a single layer formed of any one of an inorganic material and an organic material to prevent a light emitting device from being damaged by impurities, such as an alkali ion discharged from the substrate SUB during a follow-up process. Alternatively, the first buffer layer BUF1 can be formed as multiple layers formed of different inorganic materials. Also, the first buffer layer BUF1 can be formed as multiple layers formed of an organic material layer and an inorganic material layer. The inorganic material layer can include any one of a silicon oxide film (SiOx) and a silicon nitride film (SiNx). The organic material may include photoacryl.

A semiconductor layer A can be positioned on the first buffer layer BUF1. The semiconductor layer A can include a source region SA and a drain region DA spaced apart from each other with a channel region CA interposed therebetween. The source region SA and the drain region DA may be conductive regions. The semiconductor layer A can be formed using amorphous silicon or polycrystalline silicon crystallized from amorphous silicon. Alternatively, the semiconductor layer A can be formed of any one of zinc oxide (ZnO), indium zinc oxide (InZnO), indium gallium zinc oxide (InGaZnO), and zinc tin oxide (ZnSnO). Further, the semiconductor layer A can be formed of a low molecular or high molecular organic material such as melocyanine, phthalocyanine, pentacene or thiophene polymer.

A gate insulating film GI is positioned on the first buffer layer BUF1 on which the semiconductor layer A is positioned, to cover the semiconductor layer A. The gate insulating film GI can be formed as a single layer formed of an inorganic material or multiple layers formed of different inorganic materials. For example, the gate insulating film GI can be formed of a silicon oxide film (SiOx), a silicon nitride film (SiNx), or a dual-layer thereof.

A gate electrode GE of a touch signal switching TFT T11 and a scan line (e.g., G1a of FIG. 6) or an emission line (e.g., G1b of FIG. 7) connected to the gate electrode GE can be disposed on the gate insulating film GI such that at least a partial region thereof overlaps a channel region CA of the semiconductor layer A. The gate electrode GE, the scan line G1a, or the emission line G1b can be formed of at least one selected from the group consisting of Mo, Al, Cr, Au, Ti, Ni, and Cu, or an alloy thereof, and can be formed as a single layer or multiple layers.

An interlayer insulating film INT can be positioned on the gate insulating film GI on which the gate electrode GE, the scan line G1a, and the emission line G1b are arranged, to cover them. The interlayer insulating film INT1 can be formed as a single layer formed of an inorganic material or as multiple layers formed of different inorganic materials. For example, the interlayer insulating film INT can be formed of a silicon oxide film (SiOx) or a silicon nitride film (SiNx).

On the interlayer insulating film INT, there can be disposed a source electrode SE, a drain electrode DE, a first touch routing line TW11 connected to the drain electrode DE and arranged to be parallel to the scan line G1a and the emission line G1b and a touch signal supply line TSW connected to the source electrode SE and arranged in a direction crossing over the scan line G1a and the emission line G1b.

A passivation film PAS can be positioned on the interlayer insulating film INT on which the source electrode SE, the drain electrode DE, the touch signal supply line TSW, and first touch routing line TW11 are disposed, to cover the same. The passivation film PAS can be formed as a single layer formed of an inorganic material or as multiple layers formed of different inorganic materials. For example, the passivation film PAS can be formed of a silicon oxide film (SiOx), a silicon nitride film (SiNx), or a dual-layer thereof.

In order to prevent moisture or oxygen from penetrating into the pixels located inside the display area, an encapsulation film ENC having a multi-layer structure in which an inorganic layer and an organic material layer are alternately arranged can be disposed on the passivation film PAS as a protective film.

When a top layer of the encapsulation film ENC is an organic film, a second buffer layer BUF2 formed of an inorganic insulating film may be additionally disposed.

First touch electrodes Tx1 to Tx6 and second touch electrodes Rx1 to Rx4 constituting the touch screen are arranged to intersect each other on the second buffer layer BUF2, as illustrated in FIG. 2.

In the display apparatus having a touch screen according to the disclosure, the first touch routing line TW11 connected to the first touch electrode Tx1 is positioned under the encapsulation layer ENC under the first touch electrode Tx1. Also, the first touch electrode Tx1 is connected to the first touch routing line TW11 exposed through a contact hole CH penetrating through the second buffer layer BUF2 and the passivation film PAS.

Therefore, since all the first touch routing lines (e.g., TW1 to TW6 in FIG. 2) have substantially the same length in the non-display area NDA and are supplied with a touch driving signal through the touch signal supply line TSW positioned in a direction crossing over the first touch routing lines, non-uniformity of parasitic capacitance due to a step coverage based on positions of the touch routing lines can be prevented to enhance touch precision and prevent signal delay due to an increase in length of the first touch routing line.

Also, since only one or a few touch signal supply lines supplying a touch driving signal can be utilized, there is no need to dispose vertical portions (e.g., portions of the first touch routing lines arranged in a direction parallel to the data lines) of the first touch routing lines for connecting to the first touch electrodes in the non-display area, significantly reducing an increase in the non-display area.

A display apparatus according to the disclosure can be described as follows.

A display apparatus having a touch screen according to a first feature of the disclosure includes: a display panel including a display area with pixels and a non-display area outside of the display area; a plurality of first touch electrodes in the display area of the display panel; a plurality of second touch electrodes crossing over the plurality of first touch electrodes in the display area of the display panel and electrically isolated from the plurality of first touch electrodes; a gate driver disposed in the non-display area of the display panel and configured to generate gate signals sequentially supplied to the pixels; a switching unit disposed in the non-display area of the display panel and configured to be controlled based on the gate signals; at least one touch signal supply line disposed in the non-display area of the display panel and configured to supply a touch driving signal to the switching unit; a plurality of first touch routing lines disposed in the non-display area of the display panel and configured to receive the touch driving signal from the switching unit and supply the touch driving signal to the plurality of first touch electrodes; and a plurality of second touch routing lines disposed in the non-display area of the display panel and configured to sense the plurality of second touch electrodes.

Each of the plurality of first touch routing lines has substantially a same length.

The at least one touch signal supply line is substantially perpendicular to each of the plurality of first touch routing lines.

The at least one touch signal supply line is disposed along a first direction and the plurality of first touch routing lines are disposed in a second direction that crosses the first direction.

The switching unit includes at least one thin film transistor (TFT) configured to receive the touch driving signal from the at least one touch signal supply line and supply the touch driving signal to each of the plurality of first touch routing lines based on the gate signals generated by the gate driver.

The gate driver includes a scan driver configured to generate a first gate signal supplied to the pixels and an emission driver configured to generate a second gate signal supplied to the pixels, and the at least one TFT is configured to be controlled by the first gate signal or the second gate signal.

The plurality of first touch routing lines are divided into a plurality of groups, in which each of the plurality of first touch electrodes is connected to a group of first touch routing lines among the plurality of groups, and the at least one TFT includes a plurality of TFTs respectively corresponding to the plurality of first touch routing lines in the plurality of groups.

Each of the plurality of TFTs includes: a gate electrode supplied with one of the first scan signal supplied from the scan driver or the second gate signal supplied from the emission driver, a first electrode supplied with the touch driving signal supplied from the touch driving signal supply line, and a second electrode configured to supply the touch driving signal to a corresponding first touch routing line, among the plurality of first touch routing lines, that is connected to the first touch electrode.

The at least one touch signal supply line includes: a first touch signal supply line configured to supply a first touch driving signal to odd-numbered touch routing lines in each group of the first touch routing lines among the plurality of groups; and a second touch signal supply line configured to supply a second touch driving signal obtained by shifting the first touch driving signal by one horizontal period to even-numbered touch routing lines in each group of the first touch routing lines among the plurality of groups.

The plurality of TFTs include a first TFT connected to the first touch signal supply line and a second TFT connected to the second touch signal supply line for each group of the first touch routing lines among the plurality of groups, and a first scan signal of one horizontal period is supplied to the first TFT and a second scan gate signal of one horizontal period obtained by shifting the first scan signal by one horizontal period is supplied to the second TFT.

The plurality of TFTs include a first TFT connected to the first touch signal supply line and a second TFT connected to the second touch signal supply line for each group of the first touch routing lines among the plurality of groups, and a first emission signal of two horizontal periods is supplied to the first TFT and a second emission signal of two horizontal periods obtained by shifting the first emission signal by one horizontal period is supplied to the second TFT.

The display panel includes a substrate having the display area and the non-display area, in which the plurality of first touch routing lines are arranged in the non-display area of the substrate and in a same direction as gate lines supplying the gate signals, and the plurality of first touch electrodes and the plurality of second touch electrodes are disposed above a protective film covering the plurality of first touch routing lines in the display area of the substrate, and the protective film is disposed between the plurality of first touch electrodes and the plurality of first touch routing lines.

The at least one touch signal supply line is arranged in a direction that crosses a direction in which the plurality of first touch routing lines are arranged, and the at least one touch signal supply line is disposed on a same layer as the plurality of first touch routing lines.

The switching unit includes at least one thin film transistor (TFT) having a gate electrode, a first electrode and a second electrode, and the first electrode of the TFT is connected to the at least one touch signal supply line, the second electrode is connected to one of the plurality of first touch routing lines, and the gate electrode is connected to the gate driver.

Each of the plurality of first touch electrodes is connected to a corresponding first touch routing line, among the plurality of first touch routing lines, that is exposed through a contact hole penetrating through the protective film.

A display apparatus having a touch screen according to a second feature of the disclosure includes: a substrate including a display area and a non-display area outside of the display area; a thin film transistor (TFT) disposed in the non-display area of the substrate, in which the TFT includes a semiconductor layer, a gate electrode, a first electrode and a second electrode; a touch signal supply line disposed in the non-display area on an interlayer insulating film covering the gate electrode of the TFT, the touch signal supply line is connected to the first electrode of the TFT; a first touch routing line disposed in the non-display area on the interlayer insulating film, spaced apart from the touch signal supply line, and connected to the second electrode of the TFT; and a first touch electrode and a second touch electrode extending to the non-display area from the display area on a protective film covering the TFT, the touch signal supply line, and the first touch routing line, in which the first touch electrode is arranged along a first direction and the second touch electrode is arranged along a second direction crossing the first direction, and the first touch electrode is electrically isolated from the second touch electrode.

The touch signal supply line and the first touch routing line are disposed in different directions.

The first touch electrode is connected to the first touch routing line exposed through a contact hole penetrating through the protective film.

The semiconductor layer of the TFT is disposed on a buffer layer positioned on the substrate, in which the gate electrode is positioned on a gate insulating film covering the semiconductor layer, the first electrode and the second electrode are spaced apart from each other on the interlayer insulating film covering the gate electrode, and the first electrode and the second electrode are respectively electrically connected to a first region and a second region of the semiconductor layer with a channel region of the semiconductor layer overlapping the gate electrode interposed therebetween through contact holes penetrating through the interlayer insulating film and the gate insulating film.

A display apparatus having a touch screen according to a third feature of the disclosure includes: a display panel including a display area and a non-display area; a plurality of first touch electrodes; a plurality of second touch electrodes; a switching unit disposed in the non-display area of the display panel; at least one touch signal supply line disposed in the non-display area of the display panel and configured to supply a touch driving signal to the switching unit; a plurality of first touch routing lines disposed in the non-display area of the display panel and configured to receive the touch driving signal from the switching unit and supply the touch driving signal to the plurality of first touch electrodes; and a plurality of second touch routing lines disposed in the non-display area of the display panel and configured to sense the plurality of second touch electrodes, in which the plurality of first touch routing lines extend along a different direction than the at least one touch signal supply line, and each of the plurality of first touch routing lines has substantially a same length in the non-display area.

A semiconductor layer of the TFT can be disposed on a buffer layer positioned on the substrate, the gate electrode can be positioned on a gate insulating film covering the semiconductor layer, the first electrode and the second electrode can be spaced apart from each other on the interlayer insulating film covering the gate electrode, and the first electrode and the second electrode can be electrically connected to a first region and a second region of the semiconductor layer with a channel region of the semiconductor layer overlapping the gate electrode interposed therebetween through contact holes penetrating through the interlayer insulating film and the gate insulating film.

It will be apparent to those skilled in the art that various modifications and variations can be made in the disclosure without departing from the spirit or scope of the invention. In this disclosure, the electroluminescence display apparatus has been described as an example, but the disclosure is not limited thereto and can be applied to any display apparatus as long as it is a display apparatus in which parasitic capacitance is not uniform due to a step coverage according to positions of touch routing lines of a touch screen or a non-display area is increased and signal delay occurs due to a difference in length between touch routing lines. Also, in the description of the embodiments of the disclosure, the numbers of the first and second touch electrodes, the first and second touch routing lines, and the touch signal supply lines are specified as an example, but it is merely illustrative and the disclosure should not be construed as being limited thereto. Also, in the description of the embodiments of the disclosure, the first touch routing line and the touch signal supply line are disposed on the same layer, but they can be disposed on different layers. Therefore, the technical scope of the disclosure should not be limited to the contents described in the detailed description of the disclosure but should be defined by the claims.

What is claimed is:

1. A display apparatus having a touch screen, the display apparatus comprising:
   a display panel including a display area with pixels and a non-display area outside of the display area;
   a plurality of first touch electrodes on an encapsulation layer in the display area of the display panel;
   a plurality of second touch electrodes crossing over the plurality of first touch electrodes in the display area of the display panel and electrically isolated from the plurality of first touch electrodes;
   a gate driver disposed in the non-display area of the display panel and configured to generate gate signals sequentially supplied to the pixels;
   a switching unit disposed in the non-display area of the display panel and configured to be controlled based on the gate signals;
   at least one touch signal supply line disposed in the non-display area of the display panel and configured to supply a touch driving signal to the switching unit;
   a plurality of first touch routing lines disposed in the non-display area of the display panel and configured to receive the touch driving signal from the switching unit and supply the touch driving signal to the plurality of first touch electrodes; and
   a plurality of second touch routing lines disposed in the non-display area of the display, panel and configured to sense the plurality of second touch electrodes,
   wherein the first touch routing lines connected to the first touch electrodes are disposed under the encapsulation layer under the first touch electrodes,
   wherein the switching unit is connected between the at least one touch signal supply line and the plurality of first touch routing lines, and
   wherein the switching unit is configured to:
   in response to receiving one of the gate signals from the gate driver, supply the touch driving signal from the at least one touch signal supply line to one of the plurality of first touch electrodes, via one of the plurality of first touch routing lines.

2. The display apparatus of claim 1, wherein each of the plurality of first touch routing lines has substantially a same length.

3. The display apparatus of claim 1, wherein the at least one touch signal supply line is substantially perpendicular to each of the plurality of first touch routing lines.

4. The display apparatus of claim 1, wherein the at least one touch signal supply line is disposed along a first direction and the plurality of first touch routing lines are disposed in a second direction that crosses the first direction.

5. The display apparatus of claim 1, wherein the switching unit includes at least one thin film transistor (TFT) configured to receive the touch driving signal from the at least one touch signal supply line and supply the touch driving signal to each of the plurality of first touch routing lines based on the gate signals generated by the gate driver.

6. The display apparatus of claim 5, wherein the gate driver includes a scan driver configured to generate a first gate signal supplied to the pixels and an emission driver configured to generate a second gate signal supplied to the pixels, and
   wherein the at least one TFT is configured to be controlled by the first gate signal or the second gate signal.

7. The display apparatus of claim 6, wherein the plurality of first touch routing lines are divided into a plurality of groups,
   wherein each of the plurality of first touch electrodes is connected to a group of first touch routing lines among the plurality of groups, and
   wherein the at least one TFT includes a plurality of TFTs respectively corresponding to the plurality of first touch routing lines in the plurality of groups.

8. The display apparatus of claim 7, wherein each of the plurality of TFTs includes:
   a gate electrode supplied with one of the first scan signal supplied from the scan driver or the second gate signal supplied from the emission driver,
   a first electrode supplied with the touch driving signal supplied from the touch driving signal supply line, and
   a second electrode configured to supply the touch driving signal to a corresponding first touch routing line, among the plurality of first touch routing lines, that is connected to the first touch electrode.

9. The display apparatus of claim 7, wherein the at least one touch signal supply line includes:
   a first touch signal supply line configured to supply a first touch driving signal to odd-numbered touch routing lines in each group of the first touch routing lines among the plurality of groups; and
   a second touch signal supply line configured to supply a second touch driving signal obtained by shifting the first touch driving signal by one horizontal period to even-numbered touch routing lines in each group of the first touch routing lines among the plurality of groups.

10. The display apparatus of claim 9, wherein the plurality of TFTs include a first TFT connected to the first touch signal supply line and a second TFT connected to the second touch signal supply line for each group of the first touch routing lines among the plurality, of groups, and
    wherein a first scan signal of one horizontal period is supplied to the first TFT and a second scan gate signal of one horizontal period obtained by shifting the first scan signal by one horizontal period is supplied to the second TFT.

11. The display apparatus of claim 9, wherein the plurality of TFTs include a first TFT connected to the first touch signal supply line and a second TFT connected to the second touch signal supply line for each group of the first touch routing lines among the plurality of groups, and
    wherein a first emission signal of two horizontal periods is supplied to the first TFT and a second emission signal of two horizontal periods obtained by shifting the first emission signal by one horizontal period is supplied to the second TFT.

12. The display apparatus of claim 1, wherein the display panel includes a substrate having the display area and the non-display area,
    wherein the plurality of first touch routing lines are arranged in the non-display area of the substrate and in a same direction as gate lines supplying the gate signals, and
    wherein the plurality of first touch electrodes and the plurality of second touch electrodes are disposed above a protective film covering the plurality of first touch routing lines in the display area of the substrate, and the protective film is disposed between the plurality of first touch electrodes and the plurality of first touch routing lines.

13. The display apparatus of claim 12, wherein the at least one touch signal supply line is arranged in a direction that crosses a direction in which the plurality of first touch routing lines are arranged, and
wherein the at least one to signal supply line is disposed on a same layer as the plurality of first touch routing lines.

14. The display apparatus of claim 13, wherein the switching unit includes at least one thin film transistor (TFT) having a gate electrode, a first electrode and a second electrode, and
wherein the first electrode of the TFT is connected to the at least one touch signal supply line, the second electrode is connected to one of the plurality of first touch routing lines, and the gate electrode is connected to the gate driver.

15. The display apparatus of claim 12, wherein each of the plurality of first touch electrodes is connected to a corresponding first touch routing line, among the plurality of first touch routing es, that is exposed through a contact hole penetrating through the protective film.

16. A display apparatus having a touch screen, the display apparatus comprising:
a substrate including a display area and a non-display area outside of the display area;
a thin film transistor (TFT) disposed in the non-display area of the substrate; wherein the TFT includes a semiconductor layer, a gate electrode, a first electrode and a second electrode;
a touch signal supply line disposed in the non-display area on an interlayer insulating film covering the gate electrode of the TFT, wherein the touch signal supply line is connected to the first electrode of the TFT;
a first touch routing line disposed in the non-display area on the interlayer insulating film, spaced apart from the touch signal supply line, and connected to the second electrode of the TFT; and
a first touch electrode and a second touch electrode extending to the non-display area from the display area on a protective film covering the TFT; the touch signal supply line, and the first touch routing line,
wherein the first touch electrode is disposed on an encapsulation layer in the display area,
wherein the first touch routing line connected to the first touch electrode is disposed under the encapsulation layer under the first touch electrode,
wherein the first touch electrode is connected to the first touch routing line exposed through a contact hole penetrating through the protective film,
wherein the first touch electrode is arranged along a first direction and the second touch electrode is arranged along a second direction crossing the first direction, and
the first touch electrode is electrically isolated from the second touch electrode, and
wherein the first touch electrode is configured to receive a touch driving signal from the touch signal supply line via the TFT.

17. The display apparatus of claim 16, wherein the touch signal supply line and the first touch routing line are disposed in different directions.

18. The display apparatus of claim 16, wherein the semiconductor layer of the TFT is disposed on a buffer layer positioned on the substrate,
wherein the gate electrode is positioned on a gate insulating film covering the semiconductor layer,
wherein the first electrode and the second electrode are spaced apart from each other on the interlayer insulating film covering the gate electrode, and
wherein the first electrode and the second electrode are respectively electrically connected to a first region and a second region of the semiconductor layer with a channel region of the semiconductor layer overlapping the gate electrode interposed therebetween through contact holes penetrating through the interlayer insulating film and the gate insulating film.

19. A display apparatus having a touch screen, the display apparatus comprising:
a display panel including a display area and a non-display area;
a plurality of first touch electrodes;
a plurality of second touch electrodes on an encapsulation layer in the display area of the display panel;
a switching unit disposed in the non-display area of the display panel;
at least one touch signal supply line disposed in the non-display area of the display panel and configured to supply a touch driving signal to the switching unit;
a plurality of first touch routing lines disposed in the non-display area of the display panel and configured to receive the touch driving signal from the switching unit and supply the touch driving signal to the plurality of first touch electrodes; and
a plurality of second touch routing lines disposed in the non-display area of the display panel and configured to sense the plurality of second touch electrodes,
wherein the first touch routing lines connected to the first touch electrodes are disposed under the encapsulation layer under the first touch electrodes,
wherein the plurality of first touch routing lines extend along a different direction than the at least one touch signal supply line, and
wherein each of the plurality of first touch routing lines has substantially a same length in the non-display area.

* * * * *